US012640572B2

(12) United States Patent
    Hsiao

(10) Patent No.: US 12,640,572 B2
(45) Date of Patent: May 26, 2026

(54) WIRELESS CHARGING DEVICE

(71) Applicant: INVENTEC CORPORATION, Taipei (TW)

(72) Inventor: Chi-Cheng Hsiao, Taipei (TW)

(73) Assignee: INVENTEC CORPORATION, Taipei (TW)

( * ) Notice: Subject to any disclaimer, the term of this patent is extended or adjusted under 35 U.S.C. 154(b) by 678 days.

(21) Appl. No.: 18/112,549

(22) Filed: Feb. 22, 2023

(65) Prior Publication Data

US 2024/0039329 A1 Feb. 1, 2024

Related U.S. Application Data

(60) Provisional application No. 63/394,010, filed on Aug. 1, 2022.

(51) Int. Cl.
| | |
|---|---|
| *H02J 7/00* | (2026.01) |
| *B60L 53/12* | (2019.01) |
| *B60L 53/124* | (2019.01) |
| *B60L 53/36* | (2019.01) |
| *B60L 53/38* | (2019.01) |
| *G05D 1/00* | (2006.01) |

(Continued)

(52) U.S. Cl.
CPC .............. *H02J 7/731* (2026.01); *B60L 53/12* (2019.02); *B60L 53/124* (2019.02); *B60L 53/36* (2019.02); *B60L 53/38* (2019.02); *G05D 1/021* (2013.01); *H02J 7/65* (2026.01); *H02J 7/70* (2026.01); *H02J 50/005* (2020.01); *H02J 50/10* (2016.02); *H02J 50/40* (2016.02); *H02J 50/402* (2020.01); *H02J 50/70* (2016.02); *H02J 50/90* (2016.02); *H05K 5/0214* (2022.08); *H05K 7/20136* (2013.01); *H05K 7/20145* (2013.01); *H02J 2207/10* (2020.01)

(58) Field of Classification Search
CPC ...... H02J 7/0042; H02J 7/0044; H02J 7/0045; H02J 7/0047; H02J 7/00309; H02J 50/10; H02J 50/40; H02J 50/70; H02J 50/005; B60L 53/12; B60L 53/124; B60L 53/36; B60L 53/38
USPC ........................................... 320/132
See application file for complete search history.

(56) References Cited

U.S. PATENT DOCUMENTS

| | | | | |
|---|---|---|---|---|
| 8,164,222 B2* | 4/2012 | Baarman | ................. | H02J 50/80 |
| | | | | 307/104 |
| 9,331,505 B2* | 5/2016 | Lambert | ............... | H02J 7/0042 |

(Continued)

*Primary Examiner* — Alexis B Pacheco
(74) *Attorney, Agent, or Firm* — Troutman Pepper Locke LLP; Tim Tingkang Xia, Esq.

(57) ABSTRACT

A wireless charging device includes a casing, a support pad, a wireless charging module and a fan. The casing has an interior space, an air inlet, an air outlet and a support surface. The air inlet and the air outlet are in fluid communication with the interior space, the support surface faces away from the interior space, and the support surface has a placement region. The support pad is disposed at the placement region. The support pad has a plurality of protrusions to support the electronic device, and the protrusions form a plurality of channels towards the air inlet. The wireless charging module is disposed in the interior space and corresponds to the placement region. The fan is disposed in the interior space and configured to suck air into the interior space through the air inlet and blow air out of the interior space through the air outlet.

16 Claims, 9 Drawing Sheets

(51) Int. Cl.

| | |
|---|---|
| *H02J 7/14* | (2006.01) |
| *H02J 7/65* | (2026.01) |
| *H02J 7/70* | (2026.01) |
| *H02J 50/00* | (2016.01) |
| *H02J 50/10* | (2016.01) |
| *H02J 50/40* | (2016.01) |
| *H02J 50/70* | (2016.01) |
| *H02J 50/90* | (2016.01) |
| *H05K 5/02* | (2006.01) |
| *H05K 7/20* | (2006.01) |

(56) References Cited

U.S. PATENT DOCUMENTS

| | | | | |
|---|---|---|---|---|
| 11,317,544 | B1 * | 4/2022 | Zeng | H02K 1/20 |
| 11,799,320 | B2 * | 10/2023 | Smith | H02J 50/80 |
| 2014/0354219 | A1 * | 12/2014 | Fan | H02J 50/12 |
| | | | | 320/108 |
| 2016/0322852 | A1 * | 11/2016 | Yeh | H04B 5/79 |
| 2016/0365745 | A1 * | 12/2016 | Hyun | H02J 50/10 |
| 2018/0224909 | A1 * | 8/2018 | Koo | H02J 50/12 |
| 2019/0027953 | A1 * | 1/2019 | Rohmer | H02J 7/0044 |
| 2019/0223329 | A1 * | 7/2019 | Moon | H02J 50/10 |
| 2019/0334359 | A1 * | 10/2019 | Asai | H02J 7/0045 |
| 2020/0035399 | A1 * | 1/2020 | Leem | H01F 38/14 |
| 2020/0235593 | A1 * | 7/2020 | Jang | H01Q 1/526 |
| 2021/0050741 | A1 * | 2/2021 | Pinkos | H01F 27/025 |
| 2021/0185854 | A1 * | 6/2021 | Sui | H01F 27/085 |
| 2021/0218256 | A1 * | 7/2021 | Yang | H01F 38/14 |
| 2022/0158491 | A1 * | 5/2022 | Wu | H05K 7/20145 |
| 2022/0166256 | A1 * | 5/2022 | Chen | H02J 50/10 |
| 2023/0074238 | A1 * | 3/2023 | Seth | H05K 7/20145 |
| 2023/0327483 | A1 * | 10/2023 | Wang | H02J 50/10 |
| | | | | 307/104 |

* cited by examiner velocity (m/s)

pressure (Pa)

temperature (°C)    velocity (m/s)

temperature (°C)

WIRELESS CHARGING DEVICE

CROSS-REFERENCE TO RELATED APPLICATIONS

This non-provisional application claims priority under 35 U.S.C. § 119(a) on Provisional Patent Application No. 63/394,010 filed in U.S.A., on Aug. 1, 2022, the entire contents of which are hereby incorporated by reference.

BACKGROUND OF THE INVENTION

Technical Field of the Invention

The invention relates to a charging device, more particular to a wireless charging device.

Description of the Related Art

As the development and progress of technology, mobile devices, such as smart phones or tablet computers, can be connected to the vehicle system through application programs (e.g., CarPlay). In order to let users not to worry about the power consumption of mobile devices, wireless chargers are further applied to the vehicles so that the mobile devices can be connected to the vehicle system through the application programs while placed on the wireless chargers for charging.

When a mobile device is placed on a wireless charger for charging, the wireless charger and the mobile device both generate heat. Under the influence of these two kinds of heat, the charging efficiency of the wireless charger may be reduced. Therefore, how to solve the aforementioned issue is one of the crucial topics in this field.

SUMMARY OF THE INVENTION

The invention provides a wireless charging device which is capable of preventing heat generated by itself and the mobile device from adversely affecting the charging efficiency.

One embodiment of the invention provides a wireless charging device. The wireless charging device is configured to charge at least one electronic device. The wireless charging device includes a casing, at least one support pad, a wireless charging module and a fan. The casing has an interior space, at least one air inlet, an air outlet and a support surface. The air inlet and the air outlet are in fluid communication with the interior space, the support surface faces away from the interior space, and the support surface has at least one placement region. The support pad is disposed at the placement region. The support pad has a plurality of protrusions, the protrusions are configured to support the electronic device, and the protrusions form a plurality of channels towards the air inlet. The wireless charging module is disposed in the interior space and corresponds to the placement region. The fan is disposed in the interior space and configured to suck air into the interior space through the air inlet and blow air out of the interior space through the air outlet.

According to the wireless charging device as disclosed in the above embodiment, the protrusions of the support pad support the electronic device, and the protrusions form the channels towards the air inlet, such that when the fan sucks air into the interior space through the air inlet, the airflow can firstly pass by the bottom of the electronic device to cool the electronic device, then the airflow enters into the interior space to cool the wireless charging module. Therefore, the electronic device and the wireless charging device can be maintained in desired temperatures for maintaining the charging efficiency.

BRIEF DESCRIPTION OF THE DRAWINGS

The invention will become more fully understood from the detailed description given hereinbelow and the accompanying drawings which are given by way of illustration only and thus are not limitative of the present invention and wherein.

DETAILED DESCRIPTION

Figure 1:
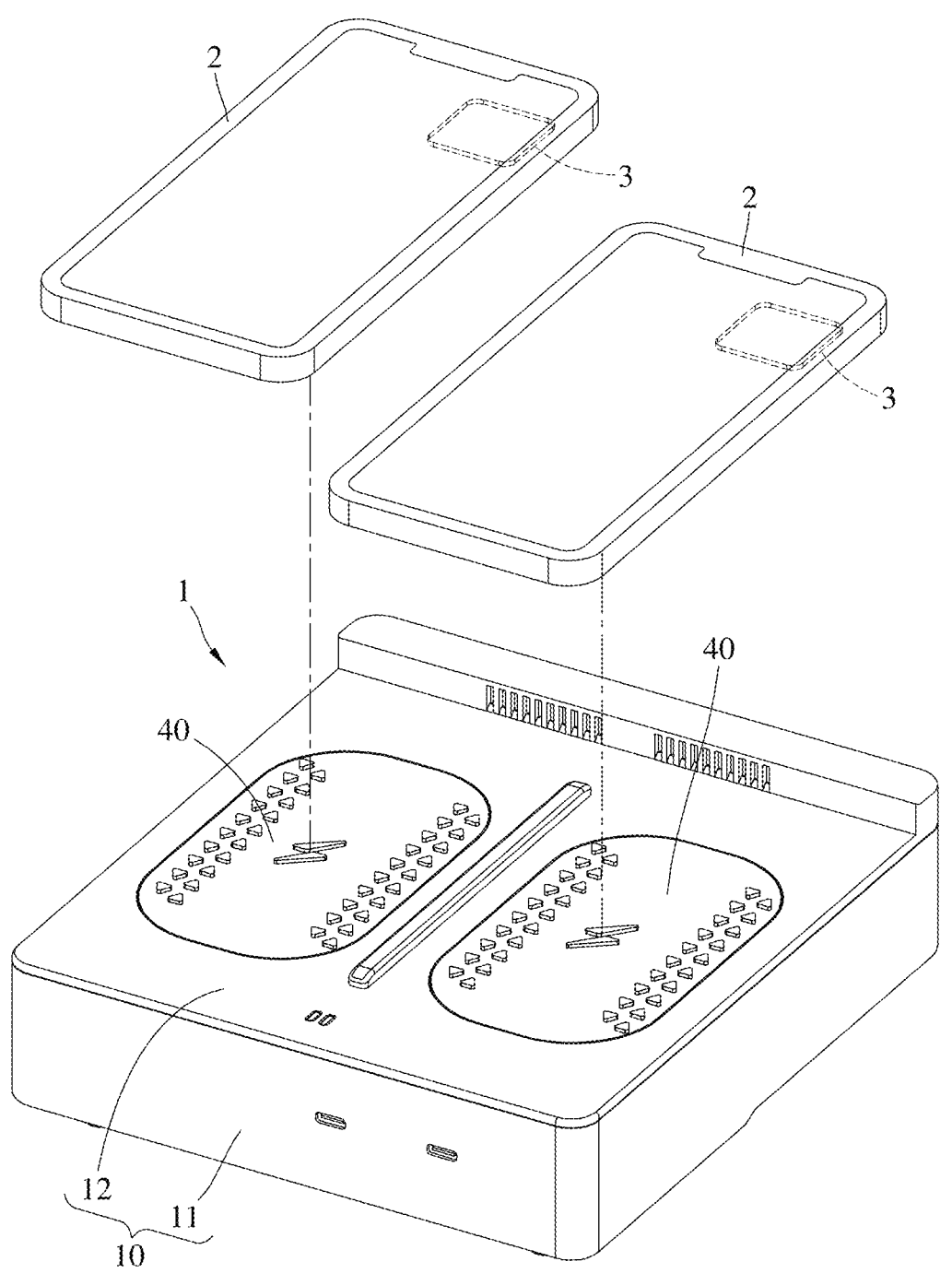
FIG. 1 is a perspective view of two electronic devices and a wireless charging device according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
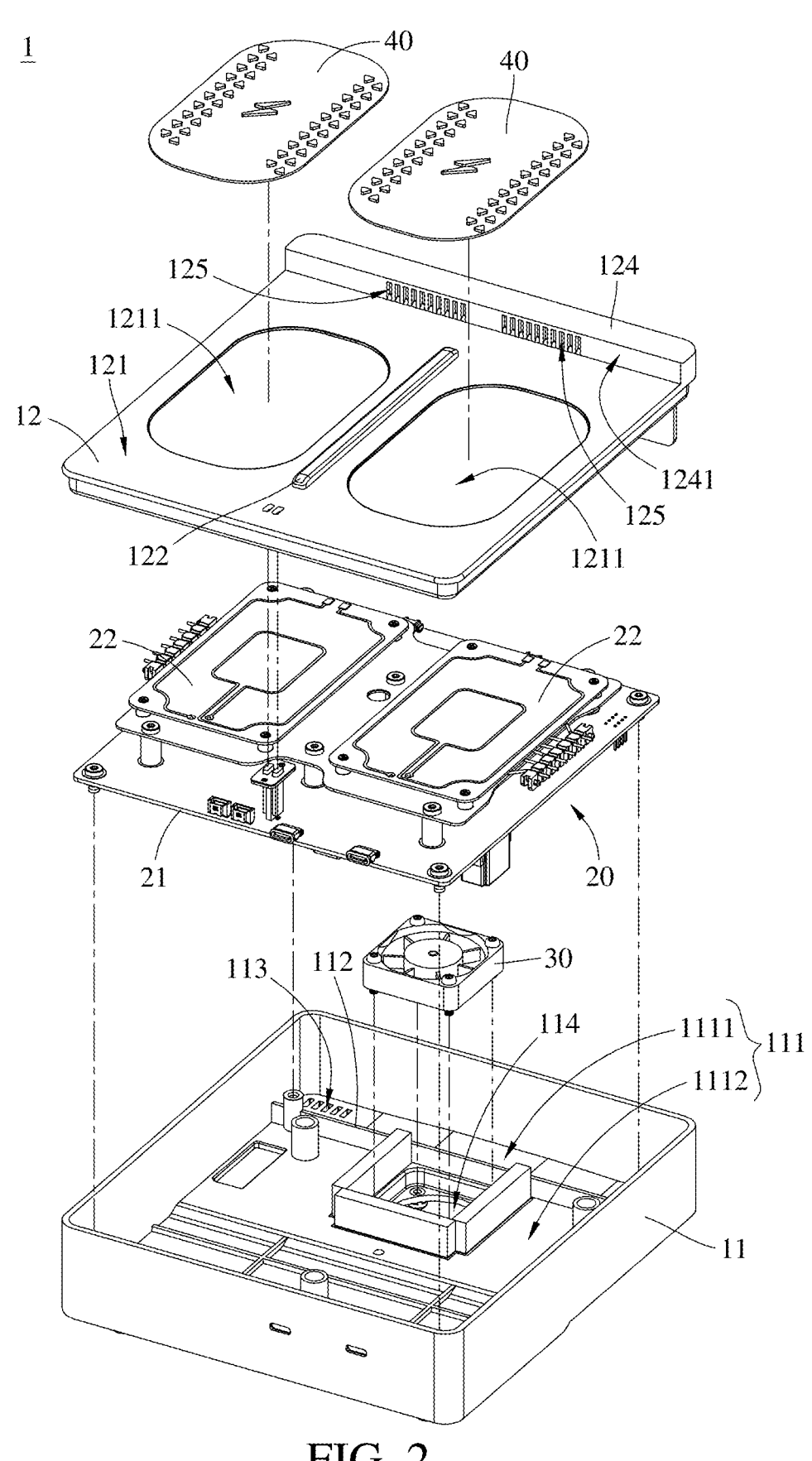
FIG. 2 is an exploded view of the wireless charging device in FIG. 1.

Refer to FIGS. 1 and 2, where FIG. 1 is a perspective view of two electronic devices 2 and a wireless charging device 1 according to a first embodiment of the invention, and FIG. 2 is an exploded view of the wireless charging device 1 in FIG. 1.

In this embodiment, the wireless charging device 1 can charge two electronic devices 2, where the electronic devices 2 are, for example, smart phones.

Figure 3:
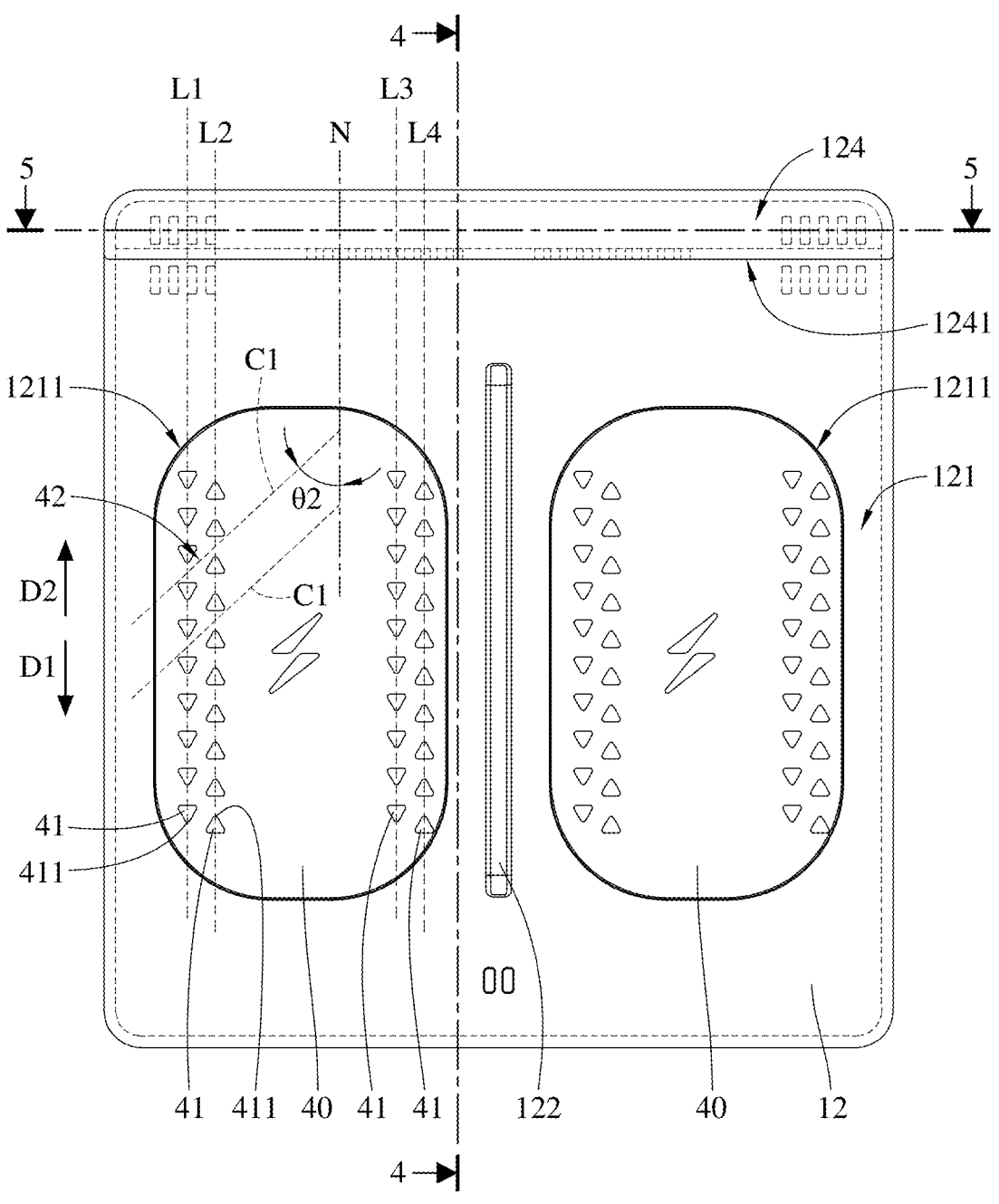
FIG. 3 is a top view of the wireless charging device in FIG. 1.
Figure 4:
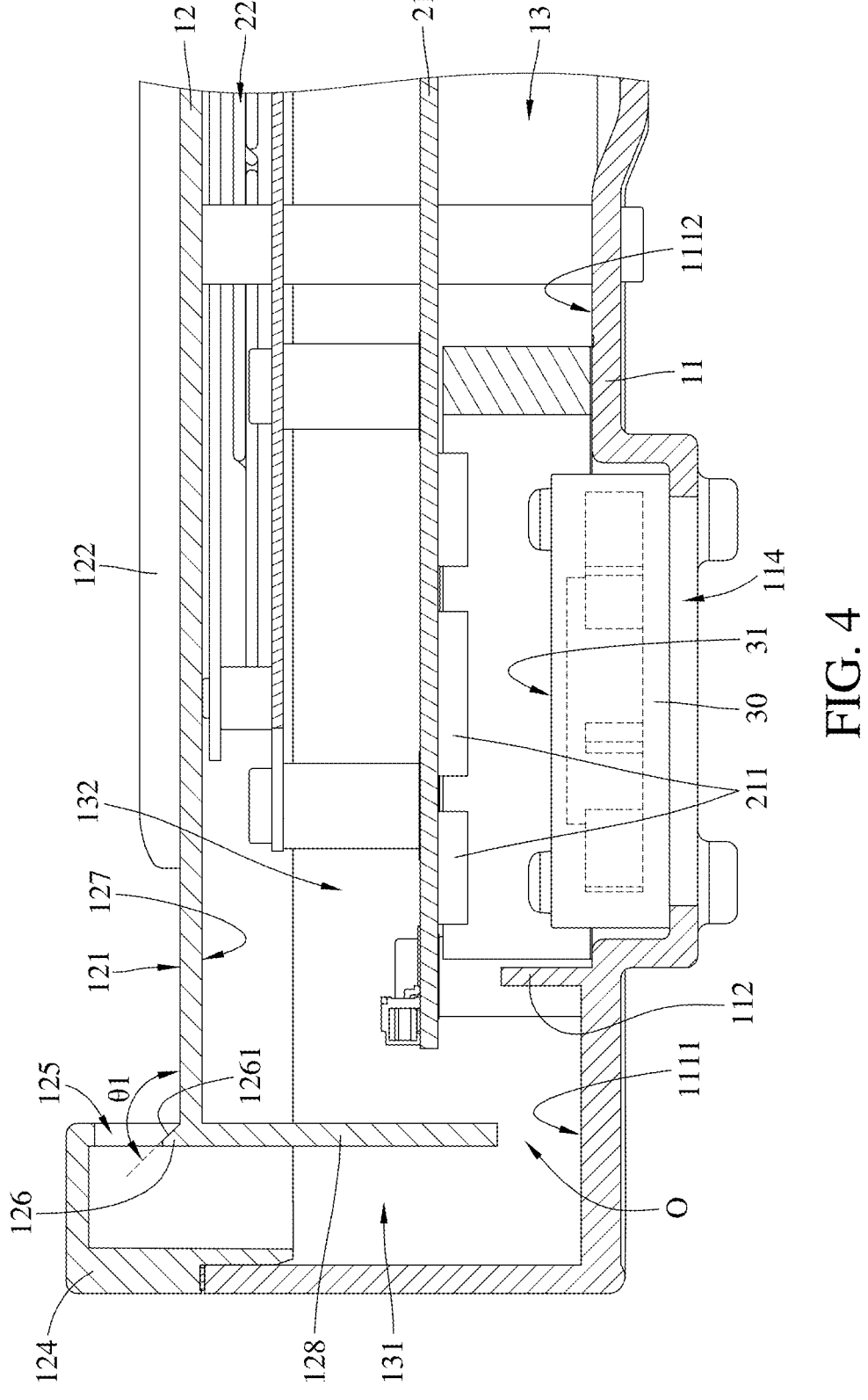
FIG. 4 is a partial cross-sectional view of the wireless charging device in FIG. 3 taken along a line 4-4.
Figure 5:
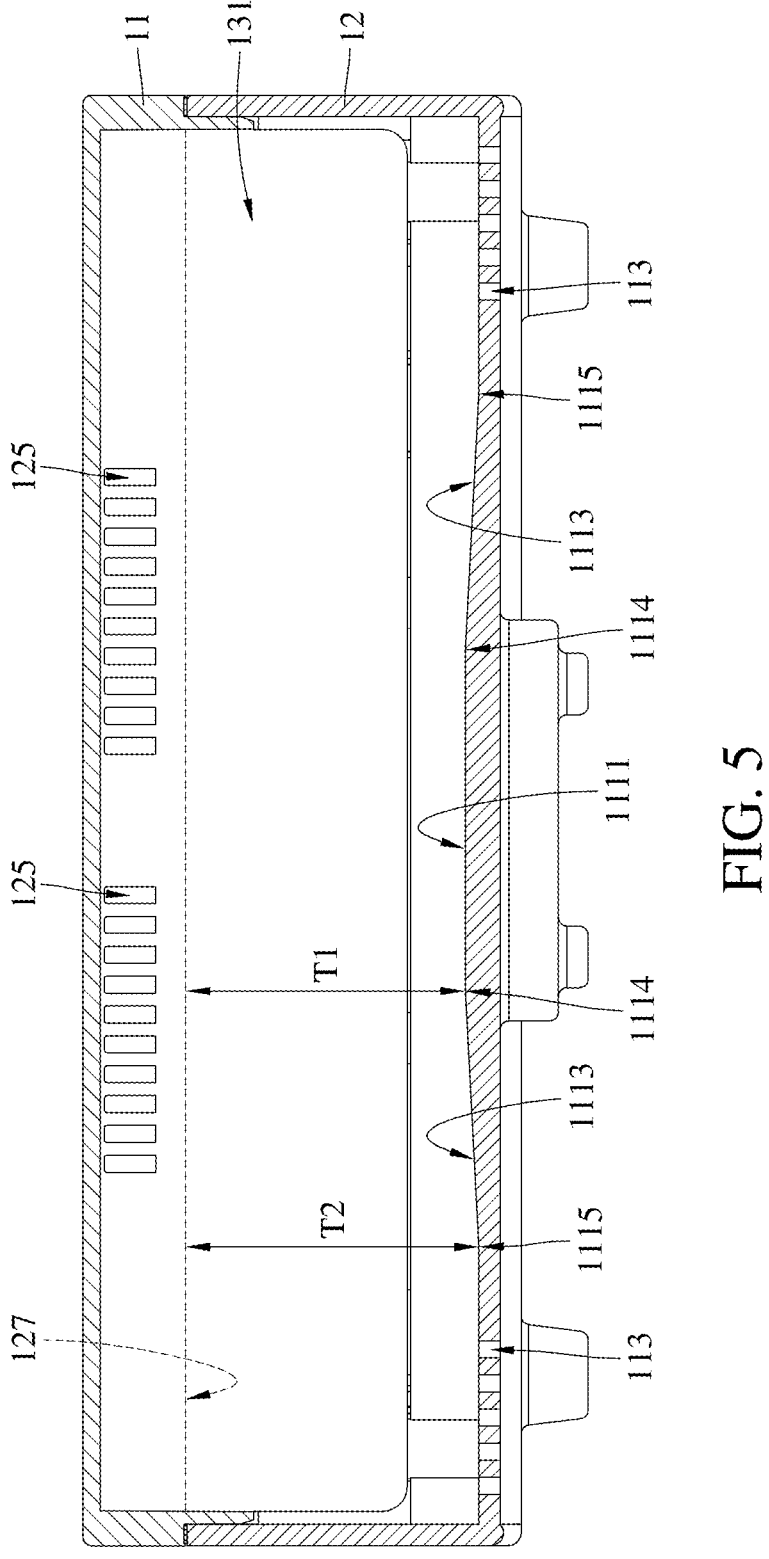
FIG. 5 is a cross-sectional view of the wireless charging device in FIG. 3 taken along a line 5-5.

Then, refer to FIGS. 2 to 5, where FIG. 3 is a top view of the wireless charging device 1 in FIG. 1, FIG. 4 is a partial cross-sectional view of the wireless charging device 1 in FIG. 3 taken along a line 4-4, and FIG. 5 is a cross-sectional view of the wireless charging device 1 in FIG. 3 taken along a line 5-5.

The wireless charging device 1 includes a casing 10, a wireless charging module 20 and a fan 30. In addition, the wireless charging device 1 may further include two support pads 40.

The casing 10 includes a base 11 and a cover 12 assembled with each other. The base 11 and the cover 12 together form an interior space 13. The interior space 13 accommodates the wireless charging module 20 and the fan 30.

The cover 12 has a support surface 121, a partition bar 122, a step structure 124, a plurality of air inlets 125 and a plurality of water-proof structures 126. The support surface 121 faces away from the interior space 13, and the support surface 121 has two placement regions 1211. The partition bar 122 protrudes from the support surface 121 and is located between the two placement regions 1211 of the support surface 121. The step structure 124 protrudes from the support surface 121, the step structure 124 has a windward surface 1241, and the windward surface 1241 stands on the support surface 121 and faces the placement regions 1211. The windward surface 1241 is, for example, perpendicular to the support surface 121, but the invention is not limited thereto; in some other embodiments, the windward surface may be at an acute or obtuse angle to the support surface. The air inlets 125 are located at the windward surface 1241 and in fluid communication with the interior space 13. The water-proof structures 126 protrude from the support surface 121 and are respectively located in the air inlets 125. Each of the water-proof structures 126 has an inclined guide surface 1261, and the inclined guide surface 1261 is at an obtuse angle θ1 to the support surface 121. The obtuse angle θ1, for example, falls within a range from 120 degrees to 150 degrees, but the invention is not limited thereto.

In this embodiment, the water-proof structures 126 can prevent liquid from entering into the interior space 13 through the air inlets 125 to adversely affect the wireless charging module 20 in the interior space 13. In addition, the inclined guide surfaces 1261 of the water-proof structures 126 can guide an external airflow into the interior space 13 through the air inlets 125.

Note that the inclined guide surfaces 1261 of the water-proof structures 126 are not restricted to being at the obtuse angle θ1 to the support surface 121; in some other embodiments, the inclined guide surfaces may be perpendicular to the support surface. In addition, the water-proof structures 126 of the cover 12 are optional, and the water-proof structures 126 of the cover 12 may be omitted when there is no need to prevent water from entering into the interior space 13 through the air inlets 125.

Moreover, the step structure 124 of the cover 12 is optional; in some other embodiments, the cover may not have any step structure, and the air inlets may be directly formed at the support surface of the cover. Furthermore, the quantity of the air inlets 125 is not restricted and may be modified to be one in some other embodiments. In addition, the partition bar 122 is an optional structure and may be omitted in some other embodiments.

In this embodiment, the cover 12 may further have an inner top surface 127 and a partition 128. The inner top surface 127 faces away from the support surface 121. The partition 128 protrudes from the inner top surface 127 so as to divide the interior space 13 into a drainage channel 131 and an accommodation area 132, where the air inlets 125 are in fluid communication with the accommodation area 132 via the drainage channel 131. The accommodation area 132 accommodates the wireless charging module 20 and the fan 30.

The base 11 has an inner bottom surface 111, an embankment wall 112, a plurality of drainage holes 113 and an air outlet 114. The inner bottom surface 111 faces the inner top surface 127, and an opening O is formed between the partition 128 of the cover 12 and the inner bottom surface 111. The opening O is in fluid communication with the drainage channel 131 and the accommodation area 132. The embankment wall 112 protrudes from the inner bottom surface 111 and covers the opening O. The embankment wall 112 divides the inner bottom surface 111 of the base 11 into a first region 1111 and a second region 1112. At least part of the first region 1111 corresponds to the drainage channel 131, and the second region 1112 corresponds to the accommodation area 132. The drainage holes 113 are located at the first region 1111 and in fluid communication with the drainage channel 131. The first region 1111 has two drainage slopes 1113, and each of the drainage slopes 1113 has a first side 1114 and a second side 1115 located opposite to each other, where a distance T1 from the first side 1114 to the inner top surface 127 is smaller than a distance T2 from the second side 1115 to the inner top surface 127. The two drainage slopes 1113 are symmetrical with each other, and the first sides 1114 of the drainage slopes 1113 are located between the second sides 1115. The drainage slopes 1113 are located between some of the drainage holes 113 and the others. In each of the drainage slopes 1113, the second side 1115 is located between the first side 1114 and some of the drainage holes 113. The air outlet 114 is located at the second region 1112 and in fluid communication with the accommodation area 132.

In this embodiment, the embankment wall 112 can prevent liquid from directly entering into the accommodation area 132 after entering into the drainage channel 131 through the air inlets 125 and landing on the first region 1111, and thus prevent liquid from adversely affecting the wireless charging module 20 and the fan 30 in the accommodation area 132.

Moreover, the drainage slopes 1113 help the liquid entering into the drainage channel 131 through the air inlets 125 and landing on the first region 1111 to leave the drainage channel 131 through the drainage holes 113 so as to prevent the liquid from accumulating and overflowing the embankment wall 112.

Note that the quantities of the drainage slopes 1113 and the drainage holes 113 are not restricted in the invention and may be modified to be one in some other embodiments. Furthermore, in another embodiment, the base may not have any drainage slope.

In addition, the partition 128 of the cover 12 and the embankment wall 112 and the drainage holes 113 of the base 11 are optional structures. When there is no need to discharge liquid and prevent liquid from affecting the wireless charging module 20 and the fan 30, the partition 128 of the cover 12 and the embankment wall 112 and the drainage holes 113 of the base 11 may be omitted.

The wireless charging module 20 includes a circuit board 21 and two coil assemblies 22. The circuit board 21 is fixed to the base 11, and the circuit board 21 has a plurality of heat sources 211 located at a surface of the circuit board 21 facing the inner bottom surface 111 of the base 11. The heat sources 211 are, for example, electronic components, such as chips. The coil assemblies 22 are fixed to the circuit board 21 and located at one side of the circuit board 21 farther away from the inner bottom surface 111 of the base 11. The coil assemblies 22 respectively correspond to the placement regions 1211 of the support surface 121 of the cover 12. The coil assemblies 22 are respectively configured to charge the electronic devices 2 placed on the placement regions 1211 via a wireless manner.

The fan 30 is, for example, an axial fan. The fan 30 is fixed to the base 11 and located at the air outlet 114 of the base 11. An air inlet side 31 of the fan 30 is located close to the heat sources 211 of the circuit board 21, such that the airflow entering into the fan 30 from the air inlet side 31 can cool the heat sources 211 of the circuit board 21.

The support pads 40 are, for example, made of rubber material. The support pads 40 are respectively disposed on the placement regions 1211 of the support surface 121 of the cover 12. The support pads 40 are the same in structure, and thus the follow descriptions merely introduce one of them. The support pad 40 has a plurality of protrusions 41. The protrusions 41 are configured to support the electronic device 2. The protrusions 41 form a plurality of channels 42 towards the air inlets 125. Specifically, the protrusions 41 are triangular protrusions and arranged along a first line L1, a second line L2, a third line L3 and a fourth line L4 which are parallel to one another, where the first line L1, the second line L2, the third line L3 and the fourth line L4 are perpendicular to the windward surface 1241, and the second line L2 and the third line L3 are located between the first line L1 and the fourth line L4. Corners 411 of some the protrusions 41 arranged along the first line L1 and the third line L3 point towards a first direction D1, and corners 411 of the others of the protrusions 41 arranged along the second line L2 and the fourth line L4 point towards a second direction D2, where the first direction D1 is opposite to the second direction D2. Some of the protrusions 41 arranged along the first line L1 and the second line L2 are in a staggered arrangement, and the others of the protrusions 41 arranged along the third line L3 and the fourth line L4 are in a staggered arrangement. The channels 42 (e.g., along a line C1 shown in FIG. 3) formed by the protrusions 41 each is at an angle θ2 to a normal line N of the windward surface 1241, and the angle θ2 falls within a range from 15 degrees to 60 degrees.

Figure 6:
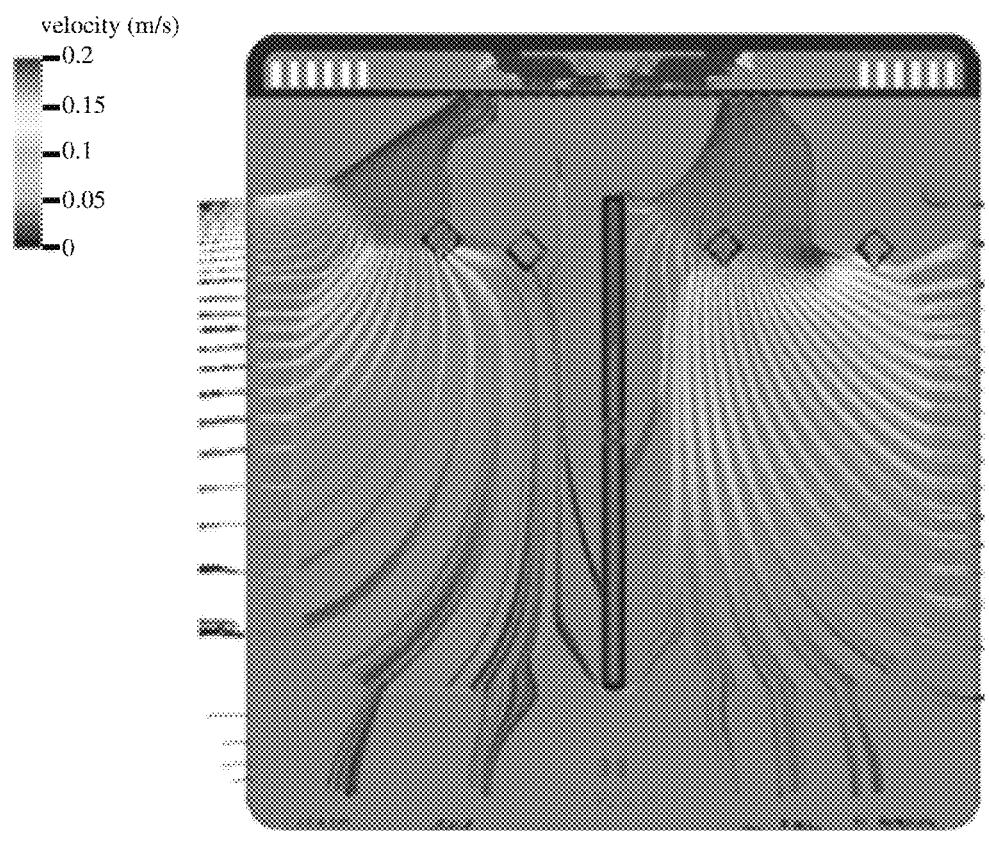
FIG. 6 shows a simulation diagram of a flow field of an airflow guided by protrusions of support pads of the wireless charging device in FIG. 3.

In this embodiment, the protrusions 41 can support the electronic devices 2 and prevent the electronic devices 2 from moving accidentally. In addition, the protrusions 41 can uplift the electronic devices 2, such that, during the operation of the fan 30, the channels 42 formed by the protrusions 41 can guide the external airflow towards the air inlets 125 from the bottoms of the electronic devices 2. Referring to FIG. 6, FIG. 6 shows a simulation diagram of a flow field of an airflow guided by the protrusions 41 of the support pads 40 of the wireless charging device 1 in FIG. 3, and as can be seen that the airflow effectively cools the electronic devices 2.

In addition, since the channels 42 (e.g., along the line C1 shown in FIG. 3) formed by the protrusions 41 each is at the angle θ2 to the normal line N of the windward surface 1241, and the angle θ2 falls within the range from 15 degrees to 60 degrees, the interference of cameras 3 of the electronic devices 2 to the airflow can be reduced. Preferably, the angle θ2 may fall within the range from 15 degrees to 30 degrees, which can further reduce the interference of the cameras 3 of the electronic devices 2 to the airflow.

Note that the degree of the angle θ2 is not restricted in the invention and may be modified according to actual requirements. Moreover, the protrusions 41 are optional structures and may be omitted.

As shown in FIGS. 1 and 3, the arrangements of the protrusions 41 of the support pads 40 can minimize the interference of the camera 3 of the electronic device 2 placed on the left placement region 1211 to the airflow. As for the electronic device 2 placed on the right placement region 1211, the interference of the camera 3 thereof to the airflow is not significant, such that the right support pad 40 and the left support pad 40 may be the same in structure; that is, the two support pads 40 are not required to be symmetrical with each other. Therefore, there is no need to produce two support pads with symmetrical structures, thereby saving cost.

Figure 7:
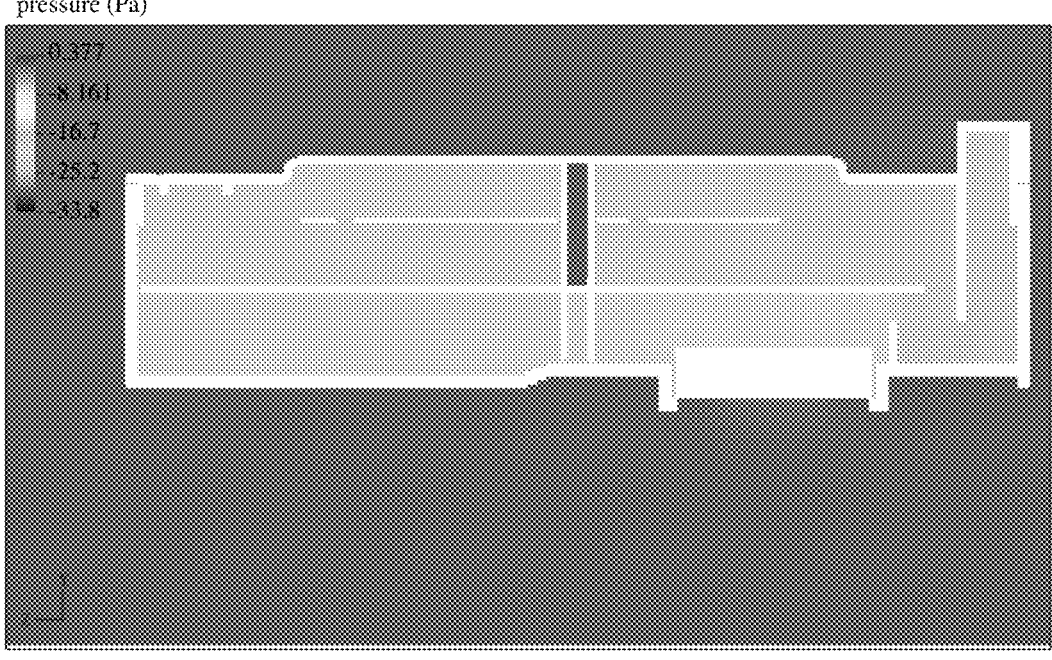
FIGS. 7 to 9 are simulation diagrams of pressure, flow field and temperature distributions of an airflow passing through the wireless charging device in FIG. 1.
Figure 8:
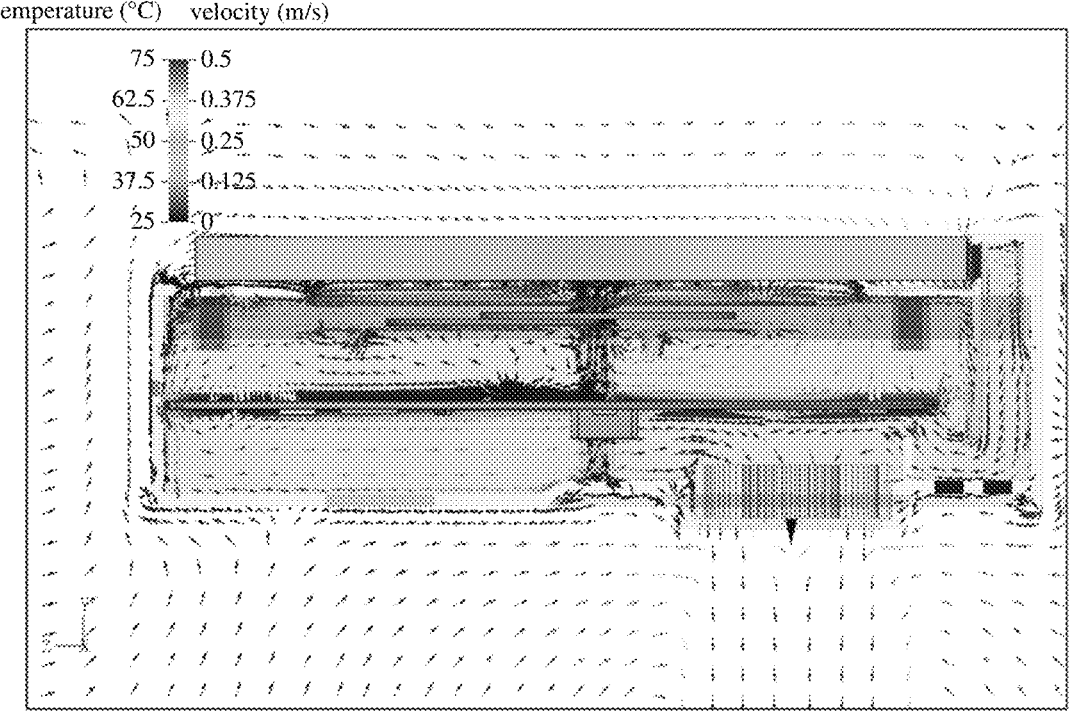
Figure 9:
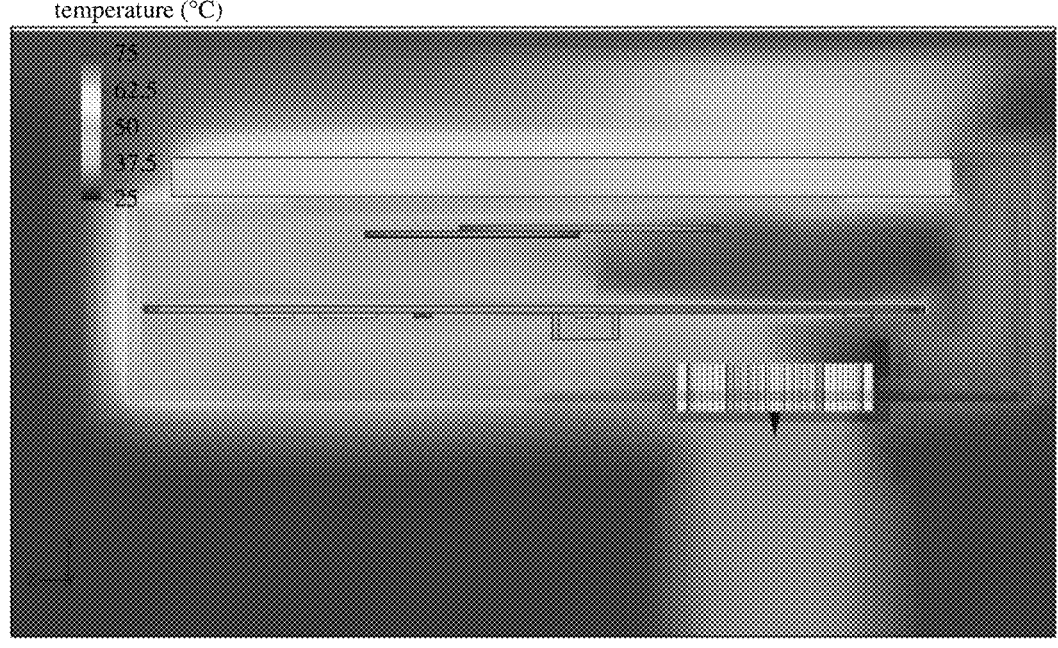

During the operation of the fan 30, the airflow entering into the interior space 13 through the air inlets 125 flows to the accommodation area 132 along the drainage channel 131, such that the airflow can cool the heat sources 211 of the circuit board 21 and the coil assemblies 22 of the wireless charging module 20, thereby maintaining the charging efficiency. Then, the fan 30 blows air out of the accommodation area 132, where the pressure, flow field and the temperature distributions of the airflow passing through the wireless charging device 1 are shown in FIGS. 7 to 9. As observing the external pressure and the interior pressure of the wireless charging device 1 of FIG. 7 from the right-hand side of the wireless charging device 1, the wireless charging device 1 is substantially in the environment of 0.377 Pa. During the operation of the fan 30, the negative pressure is formed in the wireless charging device 1, the pressure gradually decreases from the exterior to interior of the wireless charging device 1, the pressure is smallest at the place where the fan 30 is located (e.g., about −25.3 Pa), and the negative pressure in the wireless charging device 1 is sufficient, which represents that the fan 30 has a sufficient power to effectively suck air from the exterior to the interior of the wireless charging device 1, thereby ensuring the electronic devices 2 and the wireless charging device 1 to be effectively cooled. As observing the velocities of the external and internal airflows of the wireless charging device 1 and the surface temperature and interior temperature of the wireless charging device 1 of FIG. 8 from the right-hand side of the wireless charging device 1, during the operation of the fan 30, the external airflow (indicated by arrows) enters into the wireless charging device 1 from outside, and its velocity gradually increases from 0 to about 0.5 m/s, which ensures the electronic devices 2 and the wireless charging device 1 to be effectively cooled. As can be seen from FIG. 8 that the surface temperature and the interior temperature of the wireless charging device 1 fall within an appropriate range about 25° C. to 50° C., which represents that the electronic devices 2 and the wireless charging device 1 are effectively cooled by the airflow, thereby preventing heat from adversely affecting the charging efficiency of the wireless charging device 1 as possible. As observing the exterior temperature, the interior temperature and the surface temperature of the wireless charging device 1 of FIG. 9 from the right-hand side of the wireless charging device 1, during the operation of the fan 30, the external airflow enters into the wireless charging device 1 from outside, the external temperature of the wireless charging device 1 is about 25° C., and the surface temperature and the interior temperature of the wireless charging device 1 fall within an appropriate range about 25° C. to 50° C., which represents that the electronic devices 2 and the wireless charging device are effectively cooled by the airflow, thereby preventing heat from adversely affecting the charging efficiency of the wireless charging device 1 as possible.

Accordingly, the windward surface 1241 where the air inlets 125 are located faces the placement regions 1211 for the electronic devices 2 to placed thereon; that is, the placement regions 1211 for the electronic devices 2 to be placed thereon are located at one side of the air inlets 125, such that when the fan 30 sucks air into the interior space 13 through the air inlets 125, the airflow can firstly pass by the electronic devices 2 to cool the electronic devices 2, then the airflow enters into the interior space 13 to cool the wireless charging module 20. Therefore, the electronic devices 2 and the wireless charging device 1 can be maintained in desired temperatures for maintaining the charging efficiency.

Note that the quantities of the placement regions 1211 and the coil assemblies 22 are not restricted in the invention and may be modified to be one.

Figure 10:
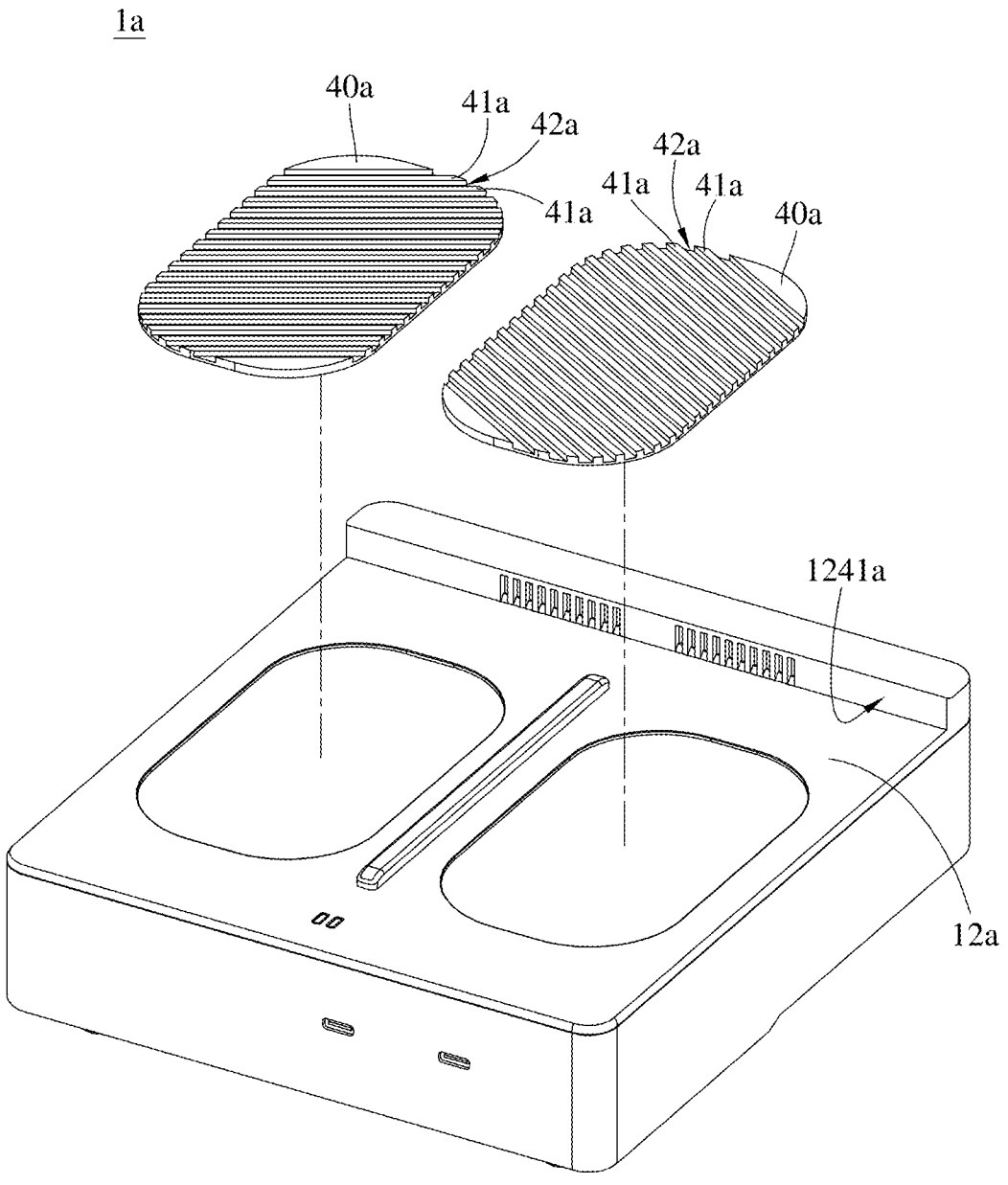
FIG. 10 is an exploded view of a wireless charging device according to a second embodiment of the invention.
Figure 11:
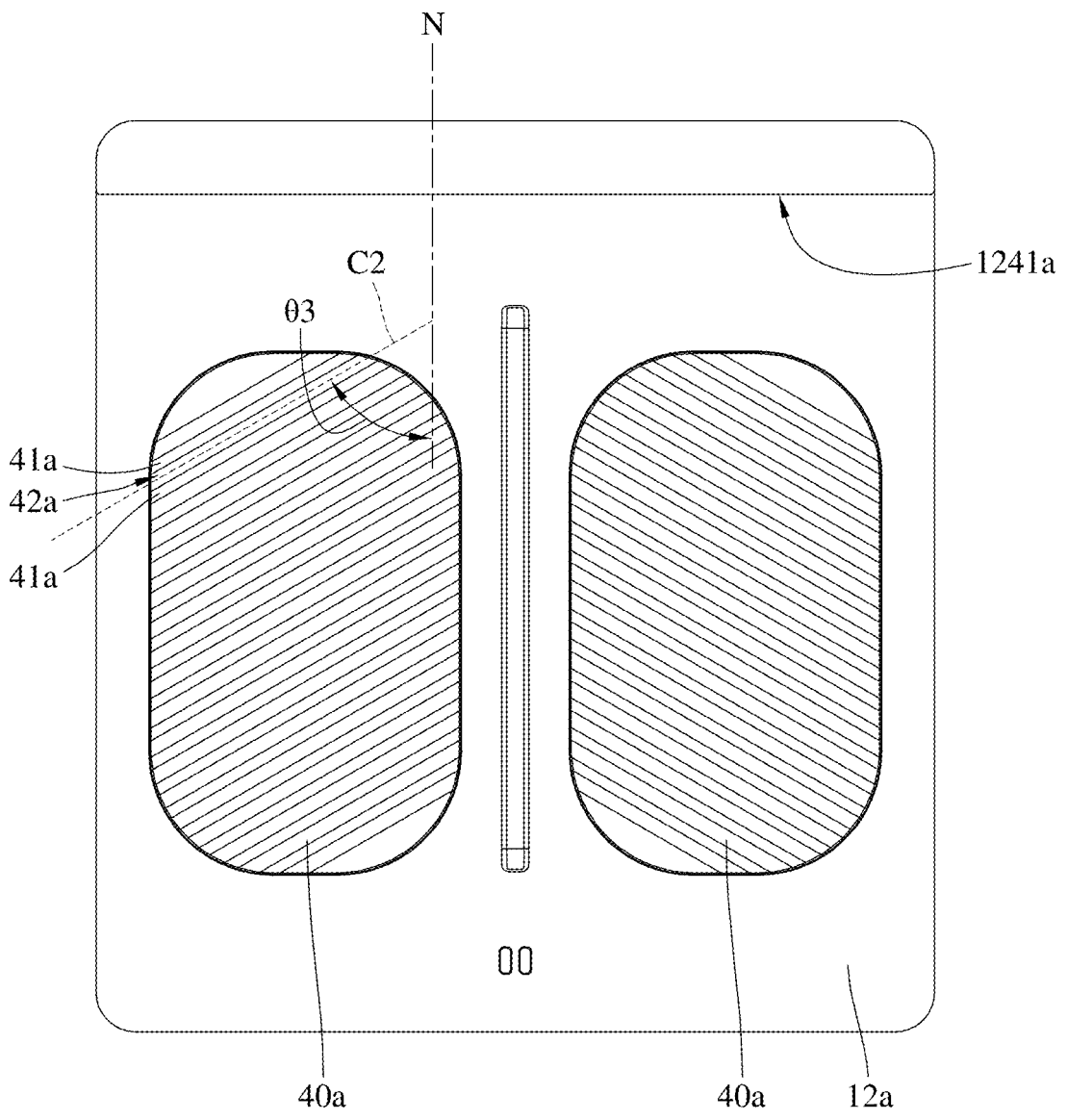
FIG. 11 is a top view of the wireless charging device in FIG. 10.

Then, refer to FIGS. 10 and 11, where FIG. 10 is an exploded view of a wireless charging device 1a according to a second embodiment of the invention, and FIG. 11 is a top view of the wireless charging device 1a in FIG. 10.

The wireless charging device 1a of this embodiment is similar to the wireless charging device 1 introduced with reference to FIGS. 1 to 6, and the differences between them is mainly the structure of the support pad. The following paragraphs merely introduce a support pad 40a of the wireless charging device 1a of this embodiment in detail, and the same parts between the wireless charging devices 1a and 1 will not be repeatedly introduced hereinafter.

In this embodiment, protrusions 41a of the support pad 40a is inclined elongated protrusions, and each channel 42a is formed between adjacent two of the protrusions 41a. The channels 42a (e.g., along a line C2 shown in FIG. 11) formed by the protrusions 41a each is at an angle θ3 to a normal line N of the windward surface 1241a of a cover 12a, and the angle θ3 falls within a range from 15 degrees to 60 degrees. Preferably, the angle θ3 may fall within a range from 15 degrees to 30 degrees.

According to the wireless charging devices as disclosed in the above embodiments, the protrusions of the support pads support the electronic devices, and the protrusions form the channels towards the air inlets, such that when the fan sucks air into the interior space through the air inlets, the airflow can firstly pass by the bottoms of the electronic devices to cool the electronic devices, then the airflow enters into the interior space to cool the wireless charging module. Therefore, the electronic devices and the wireless charging device can be maintained in desired temperatures for maintaining the charging efficiency.

In one embodiment of the invention, the wireless charging device may be applied in a vehicle, such as self-driving vehicle, electric vehicle, or semi-self-driving vehicle.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A wireless charging device, configured to charge at least one electronic device, comprising:

a casing, having an interior space, at least one air inlet, an air outlet and a support surface, wherein the at least one air inlet and the air outlet are in fluid communication with the interior space, the support surface faces away from the interior space, and the support surface has at least one placement region;

at least one support pad, disposed at the at least one placement region, wherein the at least one support pad has a plurality of protrusions, the plurality of protrusions are configured to support the at least one electronic device, and the plurality of protrusions form a plurality of channels towards the at least one air inlet;

a wireless charging module, disposed in the interior space and corresponding to the at least one placement region; and a fan, disposed in the interior space and configured to suck air into the interior space through the at least one air inlet and blow air out of the interior space through the air outlet;

wherein the casing has a step structure, the step structure protrudes from the support surface, the step structure has a windward surface, the windward surface stands on the support surface, and the at least one air inlet is located at the windward surface;

wherein each of the plurality of channels is at an angle to a normal line of the windward surface, and the angle falls within a range from 15 degrees to 60 degrees.

2. The wireless charging device according to claim 1, wherein the angle falls within a range from 15 degrees to 30 degrees.

3. The wireless charging device according to claim 1, wherein the plurality of protrusions are triangular protrusions and arranged along a first line, a second line, a third line and a fourth line which are parallel to one another, the second line and the third line are located between the first line and the fourth line, corners of some of the plurality of protrusions arranged along the first line and the third line point towards a first direction, corners of the others of the plurality of protrusions arranged along the second line and the fourth line point towards a second direction, the first direction is opposite to the second direction, some of the plurality of protrusions arranged along the first line and the second line are in a staggered arrangement, and the others of the plurality of protrusions arranged along the third line and the fourth line are in a staggered arrangement.

4. The wireless charging device according to claim 3, wherein the first line, the second line, the third line and the fourth line are perpendicular to the windward surface.

5. The wireless charging device according to claim 1, wherein the plurality of protrusions are inclined elongated protrusions, and each of the plurality of channels is formed between adjacent two of the plurality of protrusions.

6. The wireless charging device according to claim 1, wherein the casing has at least one water-proof structure, the at least one water-proof structure protrudes from the support surface and is located in the at least one air inlet.

7. The wireless charging device according to claim 6, wherein the at least one water-proof structure has an inclined guide surface, and the inclined guide surface is at an obtuse angle to the support surface.

8. The wireless charging device according to claim 7, wherein the obtuse angle falls within a range from 120 degrees to 150 degrees.

9. The wireless charging device according to claim 1, wherein the quantity of the at least one placement region is two, the two placement regions are respectively configured for two electronic devices to be placed thereon, and the windward surface faces the two placement regions.

10. The wireless charging device according to claim 9, wherein the casing further has a partition bar, and the partition bar protrudes from the support surface and is located between the two placement regions.

11. The wireless charging device according to claim 1, wherein the windward surface is perpendicular to the support surface.

12. The wireless charging device according to claim 1, wherein the casing has an inner top surface, an inner bottom surface and a partition, the inner top surface faces away from the support surface, the inner bottom surface faces the inner top surface, the partition protrudes from the inner top surface so as to divide the interior space into a drainage channel and an accommodation area, the casing further has at least one drainage hole, the at least one drainage hole is located at the inner bottom surface, the at least one air inlet and the at least one drainage hole is in fluid communication with the drainage channel, the air outlet is located at the inner bottom surface and in fluid communication with the accommodation area, and at least part of the wireless charging module and the fan are located in the accommodation area.

13. The wireless charging device according to claim 12, wherein an opening is formed between the partition and the inner bottom surface, the casing further has an embankment wall, the embankment wall protrudes from the inner bottom surface, and the embankment wall covers the opening.

14. The wireless charging device according to claim 13, wherein the embankment wall divides the inner bottom surface into a first region and a second region, at least part of the first region corresponds to the drainage channel, the second region corresponds to the accommodation area, the first region has at least one drainage slope, the at least one drainage slope has a first side and a second side located opposite to each other, a distance from the first side to the inner top surface is smaller than a distance from the second side to the inner top surface, and the second side is located between the first side and the at least one drainage hole.

15. The wireless charging device according to claim 14, wherein the quantity of the at least one drainage hole and the quantity of the at least one drainage slope both are two, the two drainage slopes are symmetrical to each other, and the two drainage slopes are located between the two drainage holes.

16. The wireless charging device according to claim 1, wherein the wireless charging module comprises a circuit board and at least one coil assembly, the circuit board is located closer to the fan than the at least one coil assembly, the circuit board has at least one heat source, and the at least one heat source is located close to an air inlet side of the fan.

* * * * *